US009559276B2

(12) United States Patent
Ahn et al.

(10) Patent No.: US 9,559,276 B2
(45) Date of Patent: Jan. 31, 2017

(54) LED METAL SUBSTRATE PACKAGE AND METHOD OF MANUFACTURING SAME

(71) Applicant: POINT ENGINEERING CO., LTD., Asan-si (KR)

(72) Inventors: Bum Mo Ahn, Suwon-si (KR); Seung Ho Park, Hwaseong-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 14/650,672

(22) PCT Filed: Dec. 6, 2013

(86) PCT No.: PCT/KR2013/011265
§ 371 (c)(1),
(2) Date: Jun. 9, 2015

(87) PCT Pub. No.: WO2014/092392
PCT Pub. Date: Jun. 19, 2014

(65) Prior Publication Data
US 2016/0190407 A1      Jun. 30, 2016

(30) Foreign Application Priority Data

Dec. 12, 2012   (KR) .................. 10-2012-0144393

(51) Int. Cl.
*H01L 33/62*          (2010.01)
*H01L 33/48*          (2010.01)

(52) U.S. Cl.
CPC ............ *H01L 33/62* (2013.01); *H01L 33/486* (2013.01); *H01L 2224/13* (2013.01);
(Continued)

(58) Field of Classification Search
CPC .......... H01L 33/32; H01L 33/38; H01L 33/62; H01L 33/486
(Continued)

(56) References Cited

U.S. PATENT DOCUMENTS

| 7,268,014 B2 | 9/2007 | Lee et al. .................. 438/106 |
| 8,516,692 B2* | 8/2013 | Oshika .................. H01L 24/29 174/264 |
| 2013/0049564 A1* | 2/2013 | Jung .................. H01S 5/02469 313/45 |

FOREIGN PATENT DOCUMENTS

| EP | 2 535 954 A1 | 12/2012 | ............. H01L 33/48 |
| JP | 2001 036154 | 2/2001 | ............. H01L 23/12 |

(Continued)

OTHER PUBLICATIONS

International Searching Authority, International Search Report—International Application No. PCT/KR2013/011265, dated Feb. 26, 2014, 2 pages.

*Primary Examiner* — Monica D Harrison
(74) *Attorney, Agent, or Firm* — Sunstein Kann Murphy & Timbers LLP (57) ABSTRACT

The present invention relates to an LED metal substrate package, and particularly, to an LED metal substrate package having a heat dissipating structure, and a method of manufacturing same. The method comprises at least the steps of: forming at least one cavity having a groove of a predetermined depth in a metal substrate that is electrically separated by at least one vertical insulation layer, the cavity having one vertical insulation layer built in a floor thereof; treating all surfaces, except portions of the top surface of the metal substrate formed in the respective cavities, with shadow masking; removing an oxide film formed on the surface portions that have not been treated with masking; depositing an electrode layer on each of the surface portions (Continued)

of the oxide layer that have been removed; removing the shadow mask; performing Au/Sn soldering on the electrode layer and bonding an optical device chip; and wire bonding one electrode of the optical device, disposed on one side of the metal substrate with respect to each of the vertical insulation layers, through wires to the metal substrate disposed on the other side of each of the vertical insulation layers. The present invention forms solder using Au/Sn material, which has good heat dissipating characteristics and good bonding characteristics, on the electrode layer to bond an optical device chip, so as to have excellent heat dissipating performance compared to existing LED metal packages that use Ag epoxy.

10 Claims, 11 Drawing Sheets

(52) U.S. Cl.
 CPC ............... *H01L 2224/48091* (2013.01); *H01L 2224/73265* (2013.01); *H01L 2933/0033* (2013.01); *H01L 2933/0066* (2013.01)
(58) Field of Classification Search
 USPC .......................................................... 257/99
 See application file for complete search history.

(56) References Cited

FOREIGN PATENT DOCUMENTS

| KR | 10-0593943 | 6/2006 | ............. H01L 33/00 |
| KR | 10-2011-0109651 | 10/2011 | ............. H01L 33/62 |
| KR | 10-2012-0125350 | 11/2012 | ............. H01L 33/48 |

\* cited by examiner

LED METAL SUBSTRATE PACKAGE AND METHOD OF MANUFACTURING SAME

TECHNICAL FIELD

The present invention relates to an LED metal substrate package, more particularly to an LED metal substrate package having a heat radiating structure and a method for manufacturing same.

BACKGROUND ART

Semiconductor light emitting diode (LED) is receiving attention from various fields as an environment friendly light source. Recently, as applications of LEDs are expanding to various fields such as interior and exterior illuminations, automobile headlights, and back-light units (BLU) of display devices, there are needs for high optical efficiency and excellent heat radiation characteristics. For high efficiency LEDs, materials or structures of the LEDs should be improved primarily, however there is a need for improvement in the structures of the LED packages and the materials used therein.

That is, in a high efficiency LED, high temperature heat is produced, therefore this heat must be radiated effectively otherwise temperature rising on the LEDs causes ageing of the characteristics thereby shortening the lifetime. In high efficiency LED packages, efforts on effective radiation of the heat produced by the LEDs are making progress.

Figure 1:
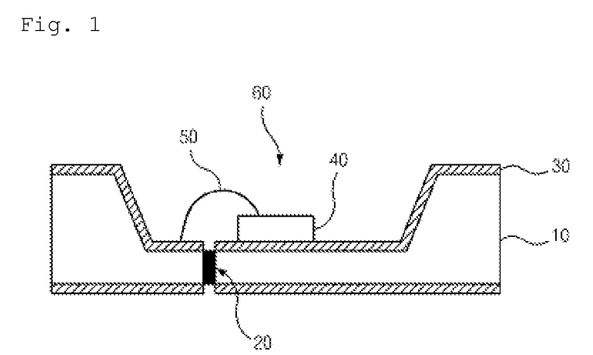
FIG. 1 is an exemplary illustration of a cross-sectional view of an optical device wherein an optical device chip 40 is mounted inside the cavity 60 of a metal substrate 10 having a vertical insulation layer 20 formed therein.

FIG. 1 is an exemplary illustration of a cross-sectional view of an optical device wherein an optical device chip 40 is mounted inside the cavity 60 of a metal substrate 10 having a vertical insulation layer 20 formed therein.

Referring to FIG. 1, the metal substrate 10 having a vertical insulation layer 20 formed therein can be formed, for example, by vertically cutting a stack into pieces having a predetermined length (width), wherein said stack is formed by alternately stacking (or forming) metal substrates and insulation layers. Aluminum, copper, or an alloy comprising at least one of foresaid materials and the like having a good thermal conductivity and electrical conductivity, may be used as a material for the metal substrate 10 having such a vertical insulation layer 20 formed therein. Further, a cavity 60, having a downwardly narrowing taper formed by machining or chemical etching and the like, is formed on the upper surface of the metal substrate 10 having a vertical insulation layer 20 formed therein.

Meanwhile, in order to enhance the reflection property of the light generated from the optical device chip 40, or the bonding property, for example, a silver-plated layer 30 is formed on the main wall of the cavity 60 and on the upper surface of the metal substrate 10 using a metal plating process such as an electroplating process, an electroless plating process, or a sputtering process. An optical device chip 40 is bonded on a portion of the upper surface of the silver-plated layer 30 inside the cavity 60 using a silver epoxy adhesive.

For an optical device having an above described structure, a silver epoxy has a good electrical conductivity and bonding property, however, the relatively low heat conductivity thereof generates a thermal resistance in a package wherein a high power optical device is mounted. Thereby, the overall heat radiation property of the package is degraded so that the life of the optical device chip 40 is eventually shortened. Moreover, the foresaid problem will be more significant if the optical device chip 40 is an UV optical device which generates more heat compared to an optical device for a visible light region.

SUMMARY OF INVENTION

Technical Problem

An objective of the present invention, devised to solve above described problems, is to provide an LED metal substrate package and a method for manufacturing same which can implement a heat radiating structure capable of enhancing the efficiency and the life of an optical device chip at a low cost.

Solution to Problem

To solve above described problems, a manufacturing method for an LED metal package according to an exemplary embodiment of the present invention includes the steps of:

forming at least one cavity comprising a concave pit reaching down to a predetermined depth of a metal substrate which is electrically separated by at least one vertical insulation layer, wherein said at least one vertical insulation layer is accommodated at the bottom thereof;

shadow masking the entire upper surface of the metal substrate using a mask except a portion of the upper surface of said metal substrate which is formed inside of each of said at least one cavity;

removing the oxide layer which is formed on said portion of the upper surface not covered by said shadow masking;

depositing an electrode layer on each of said portion of the upper surface where said oxide layer has been removed;

removing said mask;

bonding an optical device chip on said electrode layer by soldering using a gold-tin (AuSn) alloy soldering layer; and wire bonding an electrode of said optical device located in one side of said metal substrate with respect to each of said vertical insulation layer to a portion of said metal substrate located in the other side of said metal substrate with respect to each of said insulation layer.

A manufacturing method for an LED metal package according to another exemplary embodiment of the present invention includes the steps of:

forming at least one cavity comprising a concave pit reaching down to a predetermined depth of a metal substrate which is electrically separated by at least one of vertical insulation layer, wherein said at least one vertical insulation layer is accommodated at the bottom thereof;

shadow masking the entire upper surface of the metal substrate using a mask inside said at least one cavity except a portion of each of both sides of said metal substrate electrically separated by said at least one vertical insulation layer, removing the oxide layer which is formed on said portion of the upper surface not covered by said shadow masking;

depositing an electrode layer on each of said portion of the upper surface where said oxide layer has been removed;

removing said shadow mask; and flip-chip bonding an optical device chip on each of said vertical electrode layer using a gold-tin (AuSn) alloy soldering layer.

A manufacturing method for an LED metal package according to yet another exemplary embodiment of the present invention includes the steps of:

forming at least one cavity comprising a concave pit reaching down to a predetermined depth of a metal substrate which is electrically separated by at least one vertical insulation layer, wherein said at least one vertical insulation layer is accommodated at the bottom thereof;

forming a plating layer by metal plating the upper surface of said metal substrate wherein said at least one cavity is formed;

masking a portion of said upper surface of said plating layer which is located in one side of said metal substrate with respect to each of said vertical insulation layer, by using a layer mask;

etching an area of said plating layer not masked by said masking so that said plating layer, which is being masked, forms an electrode layer;

removing said layer mask;

bonding an optical device chip on said electrode layer using a gold-tin (AuSn) alloy soldering layer; and wire bonding an electrode of said optical device located in one side of said metal substrate with respect to each of said vertical insulation layer to a portion of said metal substrate located in the other side of said metal substrate with respect to each of said vertical insulation layer.

Advantageous Effects of Invention

According to an exemplary embodiment of the present invention as described above, an electrode layer is formed on a portion of a metal package comprising aluminum, then an optical device chip is bonded on said electrode layer using a gold-tin (Au/Sn) alloy soldering layer having excellent heat radiation and bonding properties so that the package has a better heat radiation property than the LED metal package using a conventional silver (Ag) epoxy, as a result, it has an effect that the efficiency and the lifetime of the optical device chip can be increased. Especially the UV LEDs radiate more heat than the visible LEDs, however, as described in the exemplary embodiments of the present invention, by applying gold-tin (Au/Sn) soldering to the metal package substrate comprising aluminum, the heat radiation property of the optical device chip is enhanced, so that an enhancement effect on the efficiency and the lifetime of an UV LED can be expected.

DESCRIPTION OF EMBODIMENTS

Hereinafter, a preferred exemplary embodiment of the present invention will be described in detail with reference to the accompanying drawings. In describing the present invention, the detailed description will be omitted when determined that detailed descriptions about: related publicly known functions or configurations, manufacturing process of a metal substrate wherein a vertical insulation layer is formed, and packing processes after the electrode wire bonding of an optical device chip, and the like may obscure the gist of the present invention.

Figure 2:
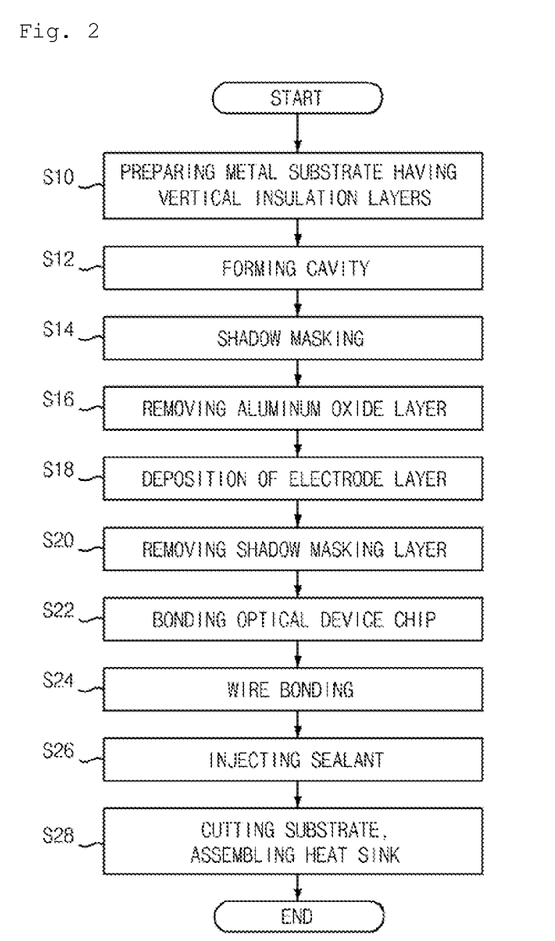
FIG. 2 is a manufacturing process flow diagram of an LED metal substrate package according to an exemplary embodiment of the present invention.

First, FIG. 2 is a manufacturing process flow diagram of an LED metal substrate package according to an exemplary embodiment of the present invention, and FIGS. 3a to 3g are the exemplary illustrations of the cross-sectional views at each corresponding process step of an LED metal substrate package being manufactured according to FIG. 2. FIG. 4 is an exemplary illustration of a cross-sectional view of an LED metal substrate package according to an exemplary embodiment of the present invention, more particularly, an exemplary illustration of a cross-sectional view of an LED metal substrate package having a chip on board (COB) type or a chip on heat-sink (COH) type arrayed structure.

Figure 3A:
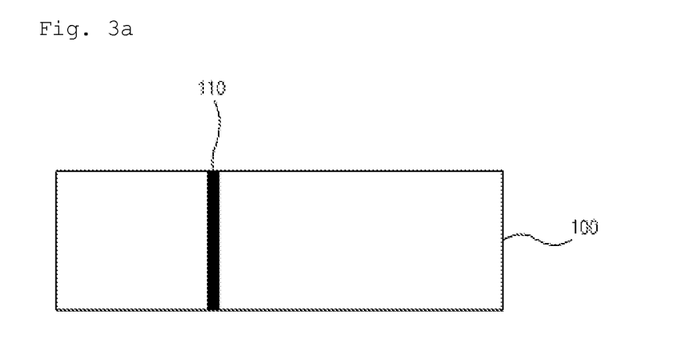
FIGS. 3a to 3g are the exemplary illustrations of the cross-sectional views at each corresponding process step of an LED metal substrate package being manufactured according to FIG. 2.
Figure 4:
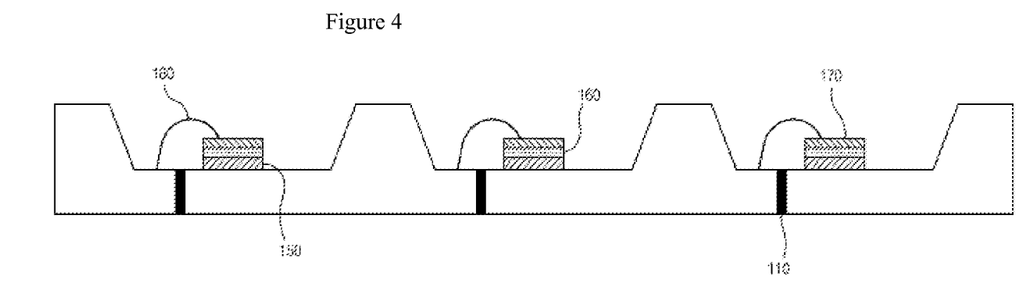
FIG. 4 is an exemplary illustration of a cross-sectional view of an LED metal substrate package according to an exemplary embodiment of the present invention.

Referring to FIGS. 2 and 3, first, in step S10, a metal substrate 100, wherein at least one vertical insulation layer 110 is formed as illustrated in FIG. 3a, is prepared. Such metal substrate 100 may be formed, for example, by vertically cutting a stack into pieces having a predetermined length (width), wherein said stack is formed by alternately stacking metal substrates and insulation layers, and there is no limitation in manufacturing such metal substrate 100 having a vertical insulation layer 110. Aluminum, copper, or an alloy comprising at least one of foresaid materials and the like having a good thermal conductivity and electrical conductivity, may be used as a material for the metal substrate 100 having such a vertical insulation layer 110 formed therein. An aluminum substrate having a vertical insulation layer 110 may be formed by anodizing the surface thereof, or unlike this, may be formed by using an insulation film made of synthetic resin material. In an exemplary embodiment of the present invention, although a metal substrate 100 having one vertical insulation layer 110 is illustrated as shown in FIG. 3a, the present invention may be implemented to a metal substrate wherein a plurality of vertical insulation layers 100 is formed as illustrated in FIG. 4.

Figure 3B:
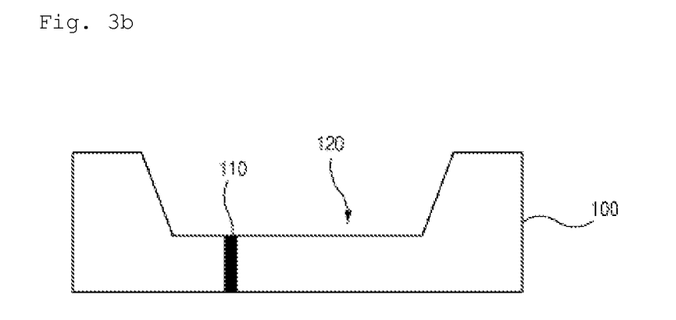

When a metal substrate 100 is prepared, later in step S12, a cavity 120 comprising a concave pit reaching down to a predetermined depth of a metal substrate 100, which is electrically separated by at least one of vertical insulation layer, is formed as shown in FIG. 3b. Such cavity 120 must be formed in a way that at least one vertical insulation layer 110 is accommodated at the bottom thereof. Since only one vertical insulation layer 110 is illustrated in FIG. 3b, accordingly, it is illustrated that one cavity 120 is being formed. However, when a plurality of insulation layers 110 is formed on the metal substrate 100 as illustrated in FIG. 4, it will be apparent to a person skilled in the art that a plurality of cavities 120 may be formed suitable for the serial-parallel structure of the optical device chip.

For reference, a cavity 120 is preferably formed to have a downwardly narrowing taper therein in order to enhance the reflecting property of the light. Further, it is preferred that an area wherein an optical device chip 170, which will be described later, is to be mounted, i.e. the right side area with respect to the vertical insulation layer 110, should be formed to have a relatively larger area while the left side area with respect to the vertical insulation layer 110 should be formed to have a smaller area. Such cavity 120 may be formed by using a mechanical process such as cutting or pressing or a chemical process such as etching.

Figure 3C:
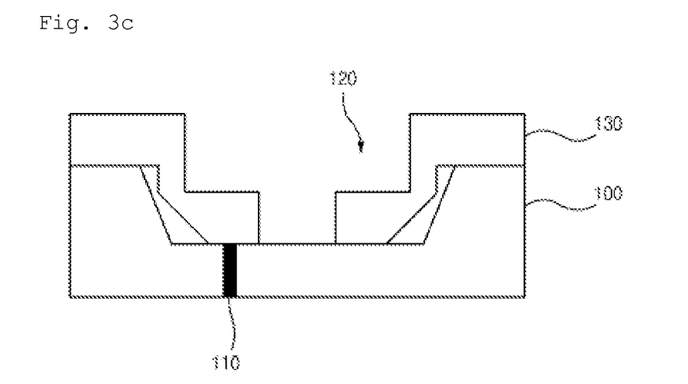
Figure 3D:
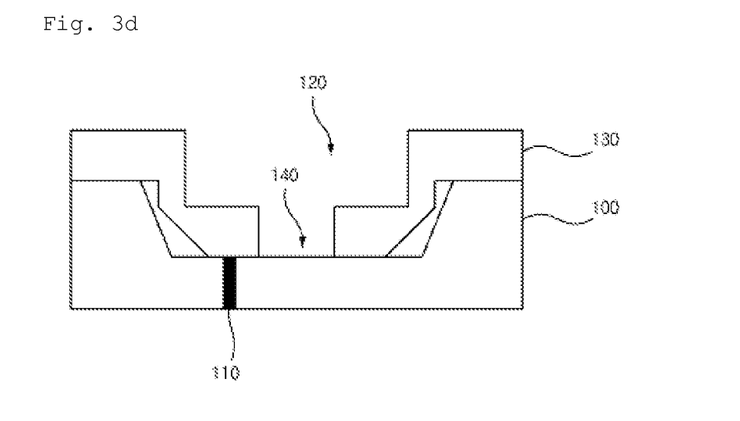

Meanwhile, in step S14, a shadow mask 130 as shown in FIG. 3c is being fixed in order to form an electrode layer on the bottom surface of said cavity 120 effectively and precisely. That is, the entire upper surface of the metal substrate 100 is shadow masked by using a mask except a portion of the upper surface of the metal substrate 100 which is formed inside of each of said cavity 120. At this time, the foresaid 'a portion of the upper surface' defined as and refers to a surface area which is not masked in order to form an electrode layer which will be described later.

After completion of shadow masking process, in step S16, the oxide layer formed on said portion of the upper surface 140 which is not masked in step S14 (FIG. 3d) is removed. Usually, since re-soldering needs often occurs due to the failure and the like when soldering a chip, it should be capable of being re-soldered up to 3 times. In the first soldering process, some amount of the prepared electrode layer is being consumed, and consequently the underlying layer affects the soldering process. Thus, at this time, for example, when an oxide layer exists on aluminum, the adhesion with the soldering material becomes difficult due to the oxide layer. Therefore, the oxide layer is being removed in order to enhance the adhesion strength with the electrode layer and the electrical conductivity. For reference, when aluminum is exposed in the air a natural oxide layer less than 1 μm is formed thereon. Such natural oxide layer is preferably being removed in order to enhance the adhesion strength of the electrode layer which will be described later. Thus, the aluminum oxide layer is being removed in a vacuum using argon gas and the like with an ion gun apparatus.

Figure 3E:
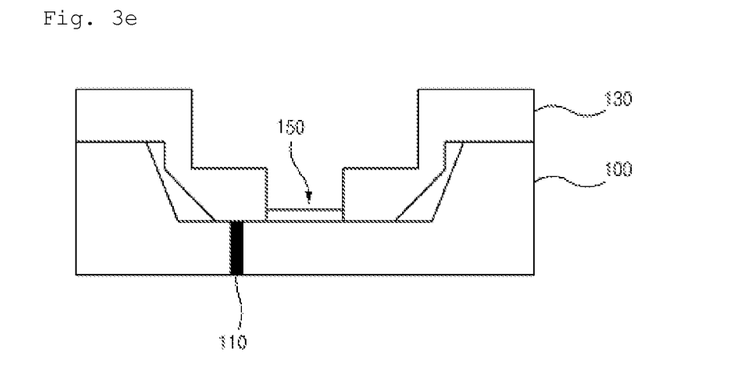

In step S18, an electrode layer 150, as shown in FIG. 3e, is vacuum deposited on each of said portion of the upper surface 140 where the mask has been removed using a sputtering method. Aluminum and copper having a good electrical conductivity may be used as a material for the electrode layer 150. The foresaid steps S16 and S18 are performed in a chamber wherein an ion gun and a sputtering apparatuses are mixedly used. An oxide layer is easily formed when removing the oxide layer on aluminum since aluminum is actively reacting with oxygen due to the characteristics thereof, therefore the removal of the oxide layer and the vacuum deposition of the electrode layer 150 must be performed in a chamber as vacuum is maintained.

Figure 3F:
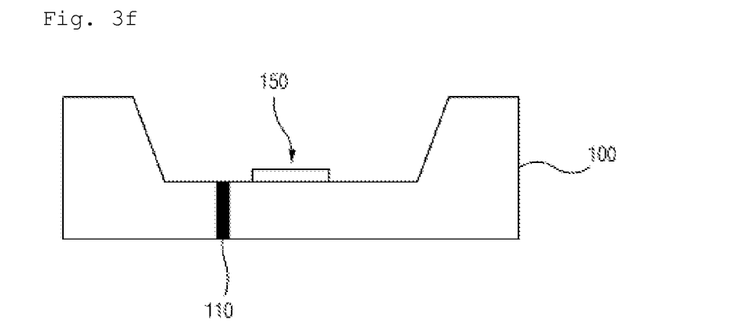
Figure 3G:
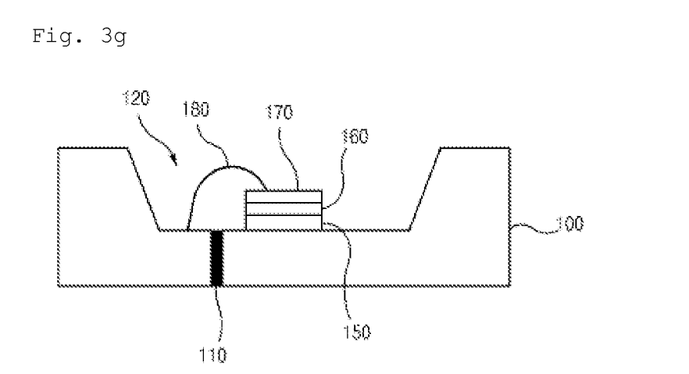

When the vacuum deposition of the electrode layer 150 is accomplished, the shadow mask is being removed as shown in FIG. 3f in step S20. Next, in step S22, an optical device chip 170 is bonded by soldering (eutectic bonding method) using a paste type mixture or a metal alloy type gold-tin (Au/Sn) soldering layer on said electrode layer 150. Through these processes, an electrode layer 150 is locally located on the larger area portion in the right side of the vertical insulation layer 110 as shown in FIG. 3g, a sequentially stacked structure wherein a gold-tin (Au/Sn) soldering layer 160 and an LED optical device chip 170 is formed on the electrode layer 150.

In this way, the bonding of said optical device chip 170 on the electrode layer 150 which is formed on the larger area portion of the metal substrate 100 formed in the cavity 120 is completed using gold-tin (Au/Sn) soldering layer. Later, one electrode of the optical device chip 170 located on the right side metal substrate 100 with respect to said vertical insulation layer 110 is wire bonded to the metal substrate 110 located in the left side of the vertical insulation layer 110 through a wire 180, in step S24. In step S26, manufacturing of an LED metal substrate package is completed by inserting a sealant material deposited with a fluorescent material for generating a desired color into the cavity 120 for protecting the optical device chip 170 as the optical device chip 170 is being mounted inside of each cavity 120. Finally, in step S28, the metal substrate 100 is horizontally or vertically separated along the cutting line and being coupled with the heat sink. This step S28 may be selectively performed according to the type of the metal substrate package.

As described above, an LED metal substrate package according to an exemplary embodiment of the present invention is a useful invention, wherein an electrode layer is formed on a portion of a metal package comprising aluminum, then an optical device chip is bonded on said electrode layer using a soldering layer made of gold-tin (Au/Sn) having excellent heat radiation and bonding properties, which is formed thereon, so that the package has a better heat radiation property than the LED metal package using a conventional silver (Ag) epoxy, as a result, it has an effect that the efficiency and the lifetime of the optical device chip can be increased.

Figure 5:
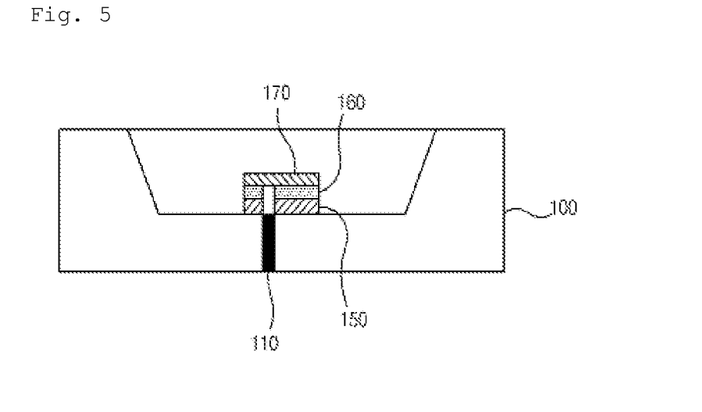
FIG. 5 is an exemplary illustration of a cross-sectional view of a flip-chip bonding type LED metal substrate package manufactured according to an exemplary embodiment of the present invention.

Meanwhile, in the exemplary embodiment of FIGS. 2 and 3, a bonding structure has been described, wherein one electrode of the optical device chip 170 is bonded to the metal substrate 100, which is in the left side of the vertical insulation layer 110 through the wire-bonding process. However, the present invention can also be applied to a metal substrate package which adopts a flip-chip bonding method as illustrated in FIG. 5 without any special modification. For this application, after forming the electrodes 150 on both sides with respect to the vertical insulation layer 110 respectively, an optical device chip 170 is bonded on each of the electrode layers 150 respectively using a soldering layer 160 made of gold-tin (Au/Sn), which is formed thereon.

In other words, after sequentially performing the steps of: forming at least one cavity 120 comprising a concave pit reaching down to a predetermined depth of a metal substrate 100 which is electrically separated by at least one of vertical insulation layer 110, wherein at least one vertical insulation layer 110 is accommodated at the bottom thereof; shadow masking the entire upper surface of the metal substrate using a mask inside said cavity 120 except a portion of each of both sides (large area portion and small area portion) of said metal substrate 100 which is electrically separated by said vertical insulation layer 110, removing the oxide layer which is formed on said portion of the upper surface not covered by said shadow mask; vacuum deposition of an electrode layer 150 on each of said portion of the upper surface where said oxide layer has been removed; removing said shadow mask; and flip-chip bonding of an optical device chip 170 on each of said electrode layer 150 using a gold-tin (AuSn) alloy soldering layer, then finally a sealant is injected into each of the cavities, thus manufacturing of an LED metal substrate package can be completed.

Similarly, according to such an LED metal substrate package, electrode layers 150 are locally formed on both sides with respect to the vertical insulation layer 110, then an optical device chip 170 is bonded on said electrode layer 150 using a gold-tin (Au/Sn) alloy soldering layer 160 having excellent heat radiation and bonding properties so that an LED metal substrate package having a superior heat radiation property than the LED metal package using a conventional silver (Ag) epoxy can be provided.

Figure 6:
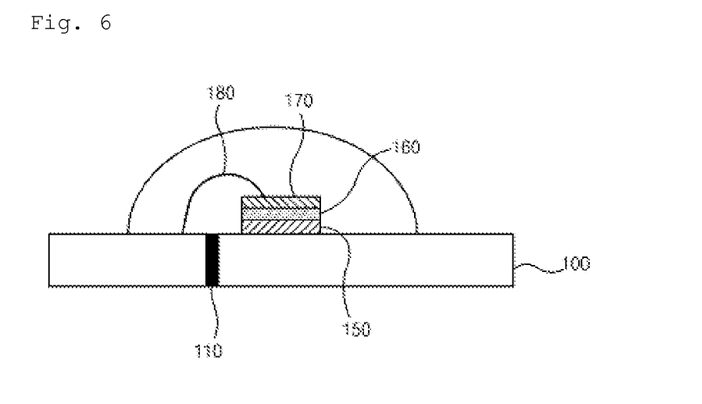
FIG. 6 is an exemplary illustration of a cross-sectional view of a flat type LED metal substrate package manufactured according to an exemplary embodiment of the present invention.

Further, in the above described exemplary embodiments, an exemplary embodiment of the present invention is described assuming a metal substrate wherein at least one cavity 120 is formed, however, the present invention may also be applied to a flat type LED metal substrate package wherein no cavity is formed as illustrated in FIG. 6.

In other words, as illustrated in FIG. 6, a flat type LED metal package may be manufactured by including the steps of: preparing a metal substrate 100 which is electrically separated by at least one of vertical insulation layer 110; shadow masking the entire upper surface of the metal substrate 100 using a mask except a portion located in one side (for example, right side) of said metal substrate 100 with respect to said vertical insulation layer 110; removing the oxide layer which is formed on said portion of the upper surface not covered by said shadow mask; vacuum deposition of an electrode layer 150 on each of said portion of the upper surface where said oxide layer has been removed; removing said mask; bonding of an optical device chip 170 on each of said electrode layer 150 using a gold-tin (AuSn) alloy soldering layer; and wire bonding of an electrode of said optical device chip 170 located in the one side (right side) of said metal substrate 100 with respect to each of said vertical insulation layer 110 to a portion of said metal substrate 100 located in the other side (left side) of said metal substrate 100 with respect to each of said vertical insulation layer 110.

Furthermore, when bonding an optical device chip using a flip-chip bonding on a flat type LED metal substrate wherein no cavity is formed, an LED metal package may be manufactured by including the steps of: preparing a metal substrate which is separated by at least one of vertical insulation layer; shadow masking the entire upper surface of the metal substrate using a mask except a portion of each of both metal substrates with respect to said vertical insulation layer; removing the oxide layer which is formed on said portion of the upper surface not covered by said shadow mask; vacuum deposition of an electrode layer on each of said portion of the upper surface where said oxide layer has been removed; removing said shadow mask; and flip-chip bonding of said optical device chip on each of said electrode layer using a gold-tin (AuSn) alloy soldering layer.

All of these LED metal substrate packages can obtain an effect that the packages have better heat radiation property than the LED metal package using a conventional silver (Ag) epoxy, by locally forming an electrode layer on a metal substrate, and bonding an optical device chip on said electrode layer using a soldering layer made of gold-tin (Au/Sn) having excellent heat radiation and bonding properties.

Figure 7:
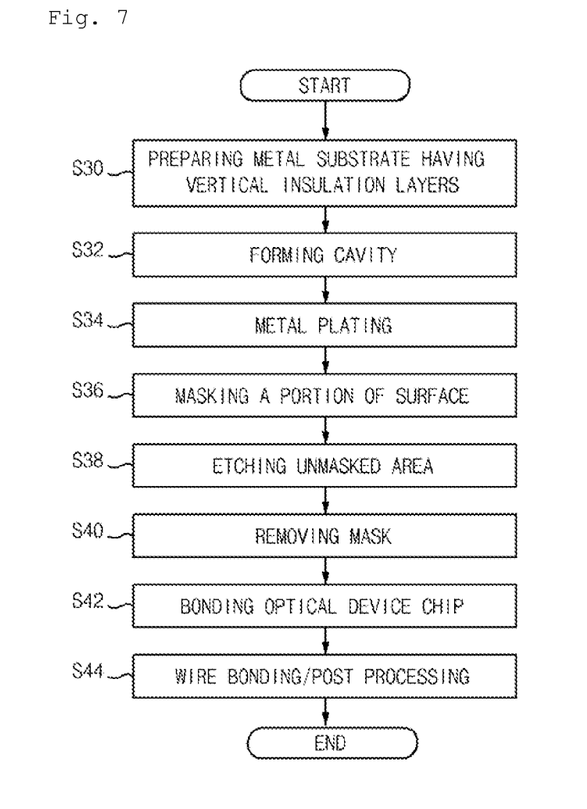
FIG. 7 is a manufacturing process flow diagram of an LED metal substrate package according to another exemplary embodiment of the present invention.

FIG. 7 is a manufacturing process flow diagram of an LED metal substrate package according to another exemplary embodiment of the present invention, and FIGS. 8a to 8g are the exemplary illustrations of the cross-sectional views at each corresponding process step of an LED metal substrate package being manufactured according to FIG. 7. In an LED metal substrate package according to an exemplary embodiment of the present invention, an electrode layer 150 can be locally formed in the large area portion existing in the right side of the vertical insulation layer 110 as illustrated in FIG. 2, however, an electrode layer 180 can be formed by etching the plating layer as shown in FIG. 7.

Figure 8A:
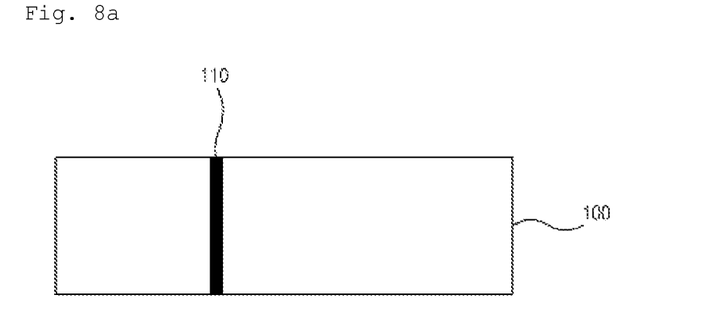
FIGS. 8a to 8g are the exemplary illustrations of the cross-sectional views at each corresponding process step of an LED metal substrate package being manufactured according to FIG. 7.

This will be described with reference to FIGS. 7 and 8. First, in step S30, an electrode substrate 100 is prepared, wherein at least one vertical insulation layer 110 is formed as illustrated in FIG. 8a. Detailed description about such metal substrate 100 will be omitted since it has been sufficiently described in FIGS. 2 and 3. For reference, although a metal substrate wherein a single vertical insulation layer 110 is formed is exemplary shown in FIG. 8a, the present invention is not limited to this but can be equally applied to the metal substrate 100 wherein a plurality of vertical insulation layers 110 is formed as illustrated in FIG. 4.

Figure 8B:
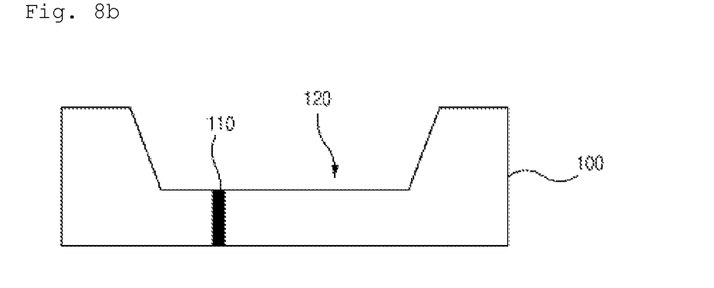

When a metal substrate 100 is prepared, later in step S32, a cavity 120 comprising a concave pit reaching down to a predetermined depth of a metal substrate 100, which is electrically separated by at least one of vertical insulation layer 110, is formed as shown in FIG. 8b. Such cavity 120 must be formed in a way that at least one vertical insulation layer 110 is accommodated at the bottom thereof. Although only one vertical insulation layer 110 is illustrated in FIG. 8b, a plurality of cavities 120 can be formed suitable for the serial-parallel structure of the optical device chip if a plurality of insulation layers 110 is formed on the metal substrate 100.

Figure 8C:
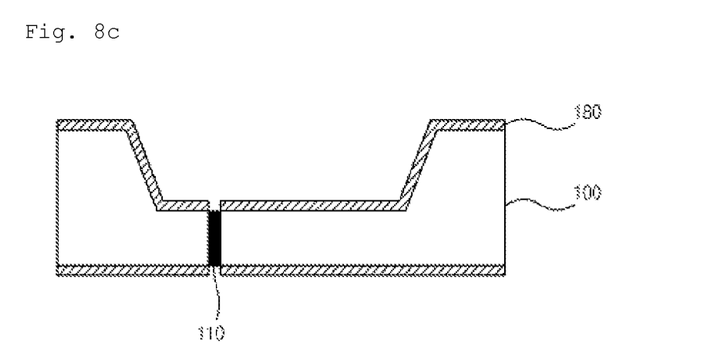
Figure 8D:
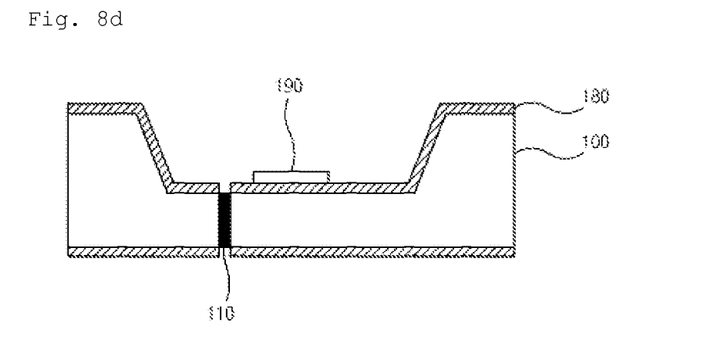

When forming of the cavity 120 is completed, later in step S34, a plating layer 180 is formed as shown in FIG. 8c by metal plating, for example, gold or copper plating, of the upper surface of the metal substrate 100, which is formed inside the cavity 120. Such metal plating layer 180 may be formed using a metal plating process such as an electroplating process, an electroless plating process, or a sputtering process. When the plating layer 180 is formed, a portion of the upper surface of the plating layer 180, which is located on the right side metal substrate 100 with respect to the vertical insulation layer 110 as shown in FIG. 8d, is masked in step S36 in order to utilize a portion of the plating layer 180 as an electrode layer. If a flip-chip bonding method is adopted, each of a portion of the upper surface of the plating layer 180, which is located on each of the metal substrates 100 respectively located in the left side and right side with respect to the vertical insulation layer 110, is being masked.

Figure 8E:
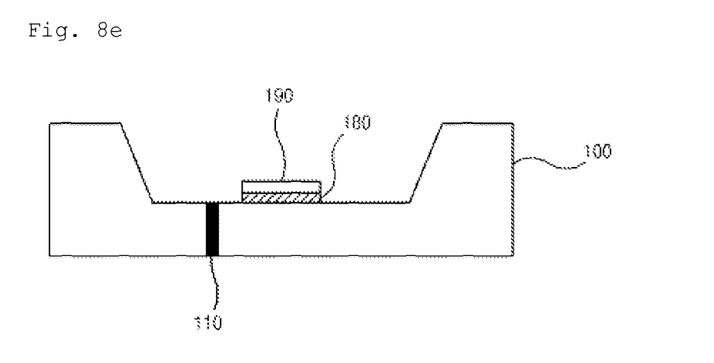

Later in step S38, the unmasked area of said plating layer 180 is being etched away as shown in FIG. 8e so that the plating layer 180, which is being masked, forms an electrode layer. Then the mask which is formed on the electrode layer 180 is removed in step S40.

When the mask is completely removed, is step S42, the optical device chip 170 is bonded to each of the electrode layers 180 which is located in the right side of the vertical insulation layer 110 by soldering using a gold-tin (AuSn) alloy soldering layer. In here, it is expressed as 'each of the electrode layers 180' since a metal substrate, wherein a plurality of cavities 120 is formed, may be assumed.

Figure 8F:
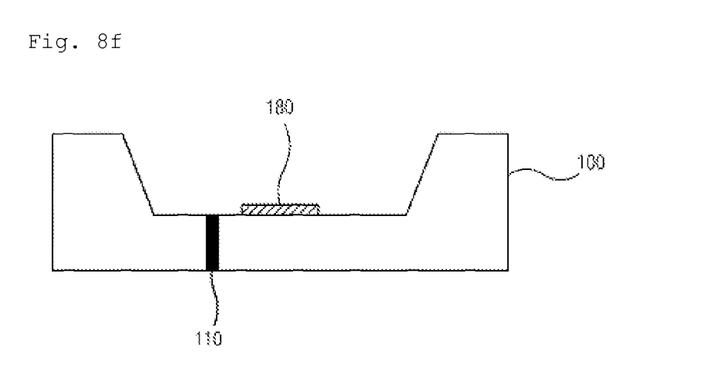
Figure 8G:
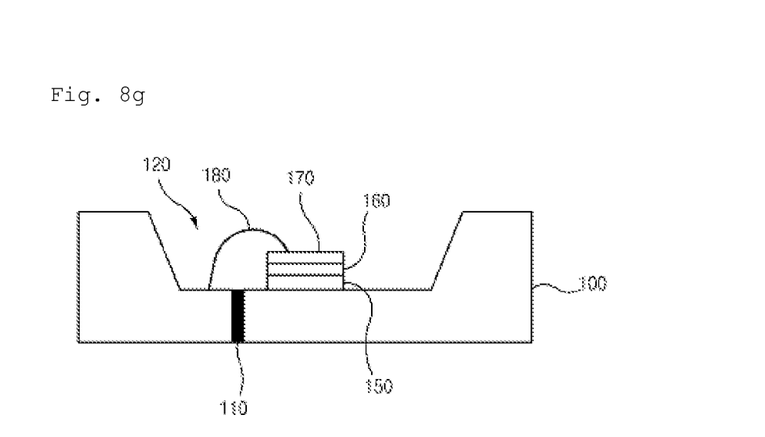

Meanwhile, when the bonding of the optical device chip 170 to the electrode layer 180 is completed by using a gold-tin alloy soldering layer, later the process is proceeded to step S44, wherein one electrode of said optical device chip 170 which is located on the right side of the metal substrate 100 with respect to said vertical electrode substrate 110, is wire bonded to the metal substrate 100 which is located in the left side of the vertical insulation layer 110 using a wire 180. When a flip-chip bonding method is used instead of a wire bonding method, the optical device chip 170 is bonded to the electrode layers, which are formed in the left side and the right side of the vertical insulation layer 110 as shown in FIG. 8g. When the bonding of the optical device 170 is completed, manufacturing of an LED metal substrate package is completed by inserting a sealant material deposited with a fluorescent material for generating a desired color into the cavity 120 for protecting the optical device chip 170 as the optical device chip 170 is being mounted inside of each cavity 120. A process step may further be included for dicing the package into the unit packages thereof as necessary.

As described above, in an LED metal substrate package according to an exemplary of the present invention, a plating layer is formed on the metal package substrate comprising aluminum, and the entire plating layer is being etched away except a portion of the plating layer so that a portion of the plating layer is converted to an electrode layer. And by bonding an optical device chip on said electrode layer using a soldering layer made of gold-tin (Au/Sn) having excellent heat radiation and bonding properties, the package has a better heat radiation property than the LED metal package using a conventional silver (Ag) epoxy, and as a result, it has an effect that the efficiency and the lifetime of the optical device chip can be increased.

Although in the exemplary embodiment shown in FIG. 7, an exemplary embodiment wherein an electrode layer is formed by forming a plating layer on the upper surface of the metal substrate 100, a manufacturing method for forming an electrode layer may also be considered wherein the entire surface is masked except a portion of the area for forming an electrode layer, and only the portion of the electrode layer is plated. In other words, after forming at least one cavity comprising a concave pit reaching down to a predetermined depth of a metal substrate which is electrically separated by at least one of vertical insulation layer, wherein at least one vertical insulation layer is accommodated at the bottom thereof, the entire upper surface except a portion of the upper surface of the metal substrate which is formed inside of each of said cavity, is being masked. Next, an electrode layer is formed by metal plating a portion of the upper surface of the unmasked metal substrate, and the mask is being removed thereafter. Then, a cross-sectional view of the metal substrate as shown in FIG. 8f can be obtained. Later, after bonding the optical device chip to each of the electrode layers respectively using a gold-tin (Au/Sn) alloy soldering layer, an electrode of said optical device chip located in one side of said metal substrate with respect to each of said vertical insulation layer is wire bonded to a portion of said metal substrate located in the other side of said metal substrate with respect to each of said insulation layer. Then, a metal substrate package as shown in FIG. 8g can be obtained.

Meanwhile, although the present invention is described with reference to the exemplary embodiments illustrated in the drawings, this is merely an example, a person of ordinary skill in the art will understand that various modifications and other equivalent exemplary embodiments are possible therefrom. For example, in the exemplary embodiments of the present invention, although exemplary embodiments are described wherein a metal substrate is assumed to accommodate one vertical insulation layer at the bottom of a cavity, the present invention may be implemented to a metal substrate wherein a plurality of vertical insulation layers is formed at the bottom of the cavity. Thus, true technical protection range of the present invention must be determined as defined in the appended claims and their equivalents.

| Description of Symbols | |
|---|---|
| 100: metal substrate, | 110: vertical insulation layer |
| 120: cavity, | 150: electrode layer |
| 160: soldering layer, | 170: optical device chip |

What is claimed is:

1. A method for manufacturing an LED metal package comprising:

forming at least one cavity comprising a concave pit reaching down to a predetermined depth of a metal substrate which is electrically separated by at least one vertical insulation layer, wherein said at least one vertical insulation layer is accommodated at the bottom thereof;

shadow masking the entire upper surface of the metal substrate using a mask except a portion of the upper surface of said metal substrate which is formed inside of each of said at least one cavity;

removing the oxide layer which is formed on said portion of the upper surface not covered by said shadow masking;

depositing an electrode layer on each of said portion of the upper surface where said oxide layer has been removed;

removing said mask;

bonding an optical device chip on said electrode layer by soldering using a gold-tin (AuSn) alloy soldering layer; and wire bonding an electrode of said optical device located in one side of said metal substrate with respect to each of said vertical insulation layer to a portion of said metal substrate located in the other side of said metal substrate with respect to each of said vertical insulation layer.

2. The method for manufacturing an LED metal package in claim 1, wherein said metal substrate and said optical device chip are aluminum and an UV LED chip respectively.

3. A method for manufacturing an LED metal package comprising:

forming at least one cavity comprising a concave pit reaching down to a predetermined depth of a metal substrate which is electrically separated by at least one vertical insulation layer, wherein said at least one vertical insulation layer is accommodated at the bottom thereof;

shadow masking the entire upper surface of the metal substrate using a mask inside said at least one cavity except a portion of each of both sides of said metal substrate electrically separated by said at least one vertical insulation layer;

removing the oxide layer which is formed on said portion of the upper surface not covered by said shadow masking;

depositing an electrode layer on each of said portion of the upper surface where said oxide layer has been removed;

removing said shadow mask; and flip-chip bonding an optical device chip on each of said vertical electrode layer using a gold-tin (AuSn) alloy soldering layer.

4. A method for manufacturing an LED metal package comprising:

forming at least one cavity comprising a concave pit reaching down to a predetermined depth of a metal substrate which is electrically separated by at least one vertical insulation layer, wherein said at least one vertical insulation layer is accommodated at the bottom thereof;

forming a plating layer by metal plating the upper surface of said metal substrate wherein said at least one cavity is formed;

masking a portion of said upper surface of said plating layer which is located in one side of said metal substrate with respect to each of said vertical insulation layer, by using a layer mask;

etching an area of said plating layer not masked by said masking so that said plating layer, which is being masked, forms an electrode layer;

removing said layer mask;

bonding an optical device chip on said electrode layer using a gold-tin (AuSn) alloy soldering layer; and wire bonding an electrode of said optical device located in one side of said metal substrate with respect to each of said vertical insulation layer to a portion of said metal substrate located in the other side of said metal substrate with respect to each of said vertical insulation layer.

5. A method for manufacturing an LED metal package comprising:

forming at least one cavity comprising a concave pit reaching down to a predetermined depth of a metal substrate which is electrically separated by at least one vertical insulation layer, wherein said at least one vertical insulation layer is accommodated at the bottom thereof;

masking the entire upper surface of the metal substrate using a mask except a portion of the upper surface of said metal substrate which is formed inside of each of said at least one cavity;

forming an electrode layer by metal plating an unmasked portion of the upper surface of said metal substrate;

removing said layer mask;

bonding an optical device chip on said electrode layer using a gold-tin (AuSn) alloy soldering layer; and wire bonding an electrode of said optical device located in one side of said metal substrate with respect to each of said vertical insulation layer to a portion of said metal substrate located in the other side of said metal substrate with respect to each of said vertical insulation layer.

6. A method for manufacturing an LED metal package comprising:

forming at least one cavity comprising a concave pit reaching down to a predetermined depth of a metal substrate which is electrically separated by at least one vertical insulation layer, wherein said at least one vertical insulation layer is accommodated at the bottom thereof;

forming a plating layer by metal plating the upper surface of said metal substrate wherein said at least one cavity is formed;

masking a portion of the surface of each of said plating layers located on both sides of said metal substrate separated by said vertical insulation layer within each cavity using a mask;

removing said layer mask; and flip-chip bonding an optical device chip on each electrode layer using a gold-tin (AuSn) alloy soldering layer.

7. A method for manufacturing an LED metal package comprising:

preparing a metal substrate which is electrically separated by at least one vertical insulation layer;

shadow masking the entire upper surface of the metal substrate using a mask except a portion located in one side of said metal substrate with respect to said vertical insulation layer; removing the oxide layer which is formed on said portion of the upper surface not covered by said shadow masking;

depositing an electrode layer on each of said portion of the upper surface where said oxide layer has been removed;

removing said mask;

bonding an optical device chip on each of said electrode layer using a gold-tin (AuSn) alloy soldering layer; and wire bonding an electrode of said optical device chip located in one side of said metal substrate with respect to each of said vertical insulation layer to a portion of said metal substrate located in the other side of said metal substrate with respect to each of said vertical insulation layer.

8. A method for manufacturing an LED metal package comprising:

preparing a metal substrate which is electrically separated by at least one vertical insulation layer;

shadow masking the entire surface of the metal substrate using a mask except a portion located in each of both sides of said metal substrate with respect to said vertical insulation layer;

removing the oxide layer which is formed on said portion of the upper surface not covered by said shadow masking;

depositing an electrode layer on each of said portion of the upper surface where said oxide layer has been removed;

removing said mask; and flip-chip bonding an optical device chip on each of said electrode layer using a gold-tin (AuSn) alloy soldering layer.

9. An LED metal package comprising:

a metal substrate wherein at least one vertical insulation layer is formed;

an electrode layer which is locally formed on said metal substrate located in one side or both sides of said vertical insulation layer with respect to said vertical insulation layer; and an optical device chip which is bonded to said electrode layer by the gold-tin (Au/Sn) alloy soldering layer, wherein said electrode layer, said soldering layer, and said optical device chip are sequentially stacked inside a cavity comprising a concave pit reaching down to a predetermined depth of said metal substrate, and sequentially stacked on said metal substrate located to one side of said vertical insulation layer which is exposed on the bottom surface of said cavity.

10. The LED metal package according to claim 9, wherein said optical device chip is an UV LED chip.

* * * * *